United States Patent
Sakurai et al.

(10) Patent No.: US 10,644,185 B2
(45) Date of Patent: May 5, 2020

(54) INFRARED DETECTING DEVICE

(71) Applicant: Asahi Kasei Microdevices Corporation, Chiyoda-ku, Tokyo (JP)

(72) Inventors: Yoshiki Sakurai, Tokyo (JP); Osamu Morohara, Tokyo (JP); Hiromi Fujita, Tokyo (JP)

(73) Assignee: Asahi Kasei Microdevices Corporation, Chiyoda-ku, Tokyo (JP)

( * ) Notice: Subject to any disclaimer, the term of this patent is extended or adjusted under 35 U.S.C. 154(b) by 3 days.

(21) Appl. No.: 16/242,190

(22) Filed: Jan. 8, 2019

(65) Prior Publication Data

US 2020/0028020 A1 Jan. 23, 2020

(30) Foreign Application Priority Data

Jan. 18, 2018 (JP) ................................ 2018-006779
Oct. 29, 2018 (JP) ................................ 2018-202805

(51) Int. Cl.
*H01L 31/109* (2006.01)
*H01L 31/0304* (2006.01)

(52) U.S. Cl.
CPC ...... *H01L 31/109* (2013.01); *H01L 31/03046* (2013.01)

(58) Field of Classification Search
CPC .......................... H01L 31/09; H01L 31/03046
See application file for complete search history.

(56) References Cited

U.S. PATENT DOCUMENTS 6,407,439 B1 * 6/2002 Hier .................... B82Y 20/00
257/431
7,224,041 B1 * 5/2007 Sherohman ....... H01L 21/02398
257/190

(Continued)

FOREIGN PATENT DOCUMENTS

JP 2009246207 A 10/2009
JP 2012207968 A 10/2012

(Continued)

OTHER PUBLICATIONS

T. D. Mishima et al., "Dislocation filtering by Al$_x$In 1—x Sb/Al y In 1—y Sb interfaces for InSb-based devices grown on GaAs (001) substrates", Applied Physics Letters, 2006, pp. 191908-1 to 191908-3, vol. 88.

*Primary Examiner* — Eugene Lee
(74) *Attorney, Agent, or Firm* — Kenja IP Law PC

(57) ABSTRACT

Provided is an infrared detecting device with high SNR. The infrared detecting device includes: a semiconductor substrate; a first compound semiconductor layer; a light receiving layer formed on the first compound semiconductor layer and containing at least In and Sb and having a predetermined range(s) of Al or Al and Ga proportion(s); a third compound semiconductor layer; and a second compound semiconductor layer containing at least In, Al, and Sb and having a predetermined range(s) of Al or Al and Ga proportion(s), in which the first compound semiconductor layer includes, in the stated order, a first A layer, a first B layer, and a first C layer, each containing at least In and Sb and having a predetermined range(s) of Al or Al and Ga proportion(s), and the proportion(s) of the Al composition or the Al composition and the Ga composition of each layer satisfy a predetermined relation(s).

20 Claims, 7 Drawing Sheets

(56) References Cited

U.S. PATENT DOCUMENTS

| | | | |
|---|---|---|---|
| 7,583,715 B2* | 9/2009 | Hill | H01S 5/20 372/43.01 |
| 8,450,773 B1* | 5/2013 | Kim | H01L 31/1844 250/338.4 |
| 10,573,782 B2* | 2/2020 | Morohara | H01L 33/025 |
| 2007/0090337 A1 | 4/2007 | Ueno et al. | |
| 2011/0221024 A1 | 9/2011 | Bornfreund et al. | |
| 2013/0043459 A1* | 2/2013 | Chen | H01L 21/02398 257/22 |
| 2014/0374701 A1* | 12/2014 | Wei | H01L 31/03046 257/18 |
| 2016/0035931 A1* | 2/2016 | Zhurtanov | H01L 33/12 257/76 |
| 2017/0244002 A1* | 8/2017 | Campbell | H01L 21/02549 |
| 2018/0366511 A1* | 12/2018 | Legoff | H01L 27/14601 |

FOREIGN PATENT DOCUMENTS

| | | |
|---|---|---|
| JP | 2017015507 A | 1/2017 |
| WO | 2005027228 A1 | 3/2005 |

* cited by examiner

FIG. 6

| Cross-sectional TEM analysis results | | |
|---|---|---|
| $Al_{0.3}In_{0.7}Sb$ / GaAs substrate | $Al_{0.15}Ga_{0.15}In_{0.7}Sb$ | |
| Line defect density of light receiving layer (lines / cm²) | $1.04 \times 10^8$ | $1.80 \times 10^8$ |

FIG. 7

| Cross-sectional TEM analysis results | Ga0.3In0.7Sb | Without line defect filter |
|---|---|---|
| Line defect density of light receiving layer (lines / cm$^2$) | $1.05 \times 10^8$ | $3.51 \times 10^8$ |

US 10,644,185 B2

INFRARED DETECTING DEVICE

TECHNICAL FIELD

This disclosure relates to infrared detecting devices.

BACKGROUND

Generally, infrared rays of a long wavelength band having a wavelength of 2 μm or more are used for human sensors for detecting human bodies, non-contact temperature sensors, gas sensors, and the like, because of its thermal effect and the effect of infrared absorption by a gas. For example, gas sensors can be used for atmospheric environment monitoring and protection, also for early fire detection and the like, and attracts attention in recent years. In particular, there are many absorption bands inherent to individual gases in the wavelength range from 2.5 μm to 6.0 μm, which is a wavelength band suitable for use in gas sensors.

The principle of the gas sensors using infrared rays is as follows. For example, when a gas is injected into the space between an infrared light source and an infrared detecting device, a specific gas absorbs infrared rays having a specific wavelength. Thus, by analyzing the wavelength spectrum before and after the injection of the gas, the type and concentration of the gas can be measured. Here, the infrared detecting devices include, for example, thermal infrared detecting devices such as pyroelectric sensors and thermopiles, and quantum infrared detecting devices using semiconductor light receiving devices. Quantum infrared detecting devices have advantages such as high SNR and high speed response compared with thermal infrared detecting devices.

A quantum infrared detecting device generally forms a PN junction in a semiconductor capable of detecting infrared rays having a wavelength of 2 μm or more, and electrons and holes generated by the absorbed infrared rays in the light receiving layer are converted into electric signals through charge separation by the internal electric field in a depletion layer at the PN junction.

However, the bandgap of a semiconductor capable of absorbing infrared rays having a wavelength of 2 μm or more is as small as 0.62 eV or less. In a semiconductor with such a small band gap, the intrinsic carrier density at room temperature increases due to thermally excited carriers and the electric resistance of devices decreases, making it impossible to obtain sufficient PN diode characteristics. This is because when the intrinsic carrier density is high, leakage current of the device such as diffusion current and dark current increases. Accordingly, infrared detecting devices provided with a cooling mechanism have been conventionally used for quantum infrared detecting devices in order to suppress thermally excited carriers.

Examples of an infrared detecting device that solves such a problem due to the influence of the ambient temperature include a quantum infrared detecting device described in WO2005027228A (PTL 1). The quantum infrared detecting device disclosed in PTL 1 suppresses the diffusion current by the layered structure and the device structure of the compound semiconductor of the sensor portion, and improves the package of signal amplifier ICs and sensors, thereby providing an infrared detecting device which is operable at room temperature and so compact that it was not conventionally available.

CITATION LIST

Patent Literature

PTL 1: WO2005027228A

SUMMARY

As described above, research and development for improving the characteristics of infrared detecting devices have been made, but further improvement in SNR characteristics is desired.

In view of these circumstances, it would be helpful to provide an infrared detecting device having a high SNR.

The present disclosure provides an infrared detecting device comprising: a semiconductor substrate; a first compound semiconductor layer formed on the semiconductor substrate and having a first conductivity type; a light receiving layer formed on the first compound semiconductor layer and containing at least In and Sb, where the light receiving layer has an Al composition at a proportion of $n_{light}$ [%] in all group III elements in the light receiving layer where $0 \leq n_{light} < 18$; a third compound semiconductor layer formed on the light receiving layer and having a second conductivity type; and a second compound semiconductor layer formed in at least one of regions between the light receiving layer and the third compound semiconductor layer or between the first compound semiconductor layer and the light receiving layer, containing at least In, Al, and Sb, having an Al composition at a proportion of $n_2$ [%] in all group III elements in the second compound semiconductor layer where $0 < n_2 < 100$, and having a film thickness of $m_2$ [nm] where $m_2 > 2$, wherein the first compound semiconductor layer comprises, in the stated order: a first A layer containing at least In and Sb and having an Al composition at a proportion of $n_{1A}$ [%] in all group III elements in the first A layer where $0 \leq n_{1A} < 18$; a first B layer containing at least In and Sb, having an Al composition at a proportion of $n_{1B}$ [%] in all group III elements in the first B layer where $0 \leq n_{1B} < 100$, and having a film thickness of $m_{1B}$ [nm]; and a first C layer containing at least In and Sb and having an Al composition at a proportion of $n_{1C}$ [%] in all group III elements in the first C layer where $0 \leq n_{1C} < 18$, where $n_{1A}$, $n_{1B}$, $n_{1C}$, $n_2$, $n_{light}$, $m_{1B}$, and $m_2$ satisfy the following relations:

$$|n_2 - n_{light}| \times m_2 \leq |n_{1B} - n_{1A}| \times m_{1B};$$

$$n_{1B} > n_{1A} \text{ and } n_{1B} > n_{1C}, \text{ or } n_{1B} < n_{1A} \text{ and } n_{1B} < n_{1C}; \text{ and}$$

$$n_2 > n_{light} + 5.$$

The present disclosure also provides an infrared detecting device comprising: a semiconductor substrate; a first compound semiconductor layer formed on the semiconductor substrate and having a first conductivity type; a light receiving layer formed on the first compound semiconductor layer, containing at least In and Sb, and having an Al composition at a proportion of $n_{Al\ light}$ [%] in all group III elements in the light receiving layer and a Ga composition at a proportion of $n_{Ga\ light}$ [%] in all group III elements in the light receiving layer, where a sum of the proportions $n_{Al\ light}$ and $n_{Ga\ light}$ satisfies a relation of $0 < n_{Al\ light} + n_{Ga\ light} < 18$; a third compound semiconductor layer formed on the light receiving layer and having a second conductivity type; and a second compound semiconductor layer formed in at least one of regions between the light receiving layer and the third compound semiconductor layer or between the first compound semiconductor layer and the light receiving layer, containing at least In, Al, and Sb, having an Al composition at a proportion of $n_{Al2}$ [%] in all group III elements in the second compound semiconductor layer where $0 \leq n_{Al2} < 100$ and a Ga composition at a proportion of $n_{Ga2}$ [%] in all group III elements in the second compound semiconductor layer where $0 \leq n_{Ga2} < 100$, and having a film thickness of $m_2$ [nm] where $m_2 > 2$, wherein the first compound semiconductor layer comprises, in the stated order: a first A layer containing at least In and Sb and having an Al composition at a proportion of $n_{Al1A}$ [%] in all group III elements in the first A layer and a Ga composition at a proportion of $n_{Ga1A}$ [%] in all group III elements in the first A layer, where a sum of the proportions $n_{Al1A}$ and $n_{Ga1A}$ satisfies a relation of $0 < n_{Al1A} + n_{Ga1A} < 18$; a first B layer containing at least In and Sb, having an Al composition at a proportion of $n_{Al1B}$ [%] in all group III elements in the first B layer and a Ga composition at a proportion of $n_{Ga1B}$ [%] in all group III elements in the first B layer, where a sum of the proportions $n_{Al1B}$ and $n_{Ga1B}$ satisfies a relation of $0 < n_{Al1B} + n_{Ga1B} < 100$, and having a film thickness of $m_{1B}$ [nm]; and a first C layer containing at least In and Sb and having an Al composition at a proportion of $n_{Al1C}$ [%] in all group III elements in the first C layer and a Ga composition at a proportion of $n_{Ga1C}$ [%] in all group III elements in the first C layer, where a sum of the proportions $n_{Al1C}$ and $n_{Ga1C}$ satisfies a relation of $0 < n_{Al1C} + n_{Ga1C} < 18$, where $n_{Al1A}$, $n_{Ga1A}$, $n_{Al1B}$, $n_{Ga1B}$, $n_{Al1C}$, $n_{Ga1C}$, $n_{Al2}$, $n_{Ga2}$, $n_{Al\,light}$, $n_{Ga\,light}$, $m_{1B}$, and $m_2$ satisfy the following relations:

$$|n_{Al2}+n_{Ga2}-(n_{Al\,light}+n_{Ga\,light})|\times m_2 \leq |n_{Al1B}+n_{Ga1B}-(n_{Al1A}+n_{Ga1A})|\times m_{1B};$$

$$|n_{Al1B}+n_{Ga1B}>n_{Al1A}+n_{Ga1A} \text{ and } n_{Al1B}+n_{Ga1B}>n_{Al1C}+n_{Ga1C}, \text{ or } n_{Al1B}+n_{Ga1B}<n_{Al1A}+n_{Ga1A} \text{ and } n_{Al1B}+n_{Ga1B}<n_{Al1C}+n_{Ga1C};$$

$$n_{Al2}+n_{Ga2}>n_{Al\,light}+n_{Ga\,light}+5;$$

$$0<n_{Ga2}/(n_{Al2}+n_{Ga2})\leq 1;$$

$$0<n_{Ga\,light}/(n_{Al\,light}+n_{Ga\,light})\leq 1;$$

$$0<n_{Ga1A}/(n_{Al1A}+n_{Ga1A})\leq 1;$$

$$0<n_{Ga1B}/(n_{Al1B}+n_{Ga1B})\leq 1; \text{ and}$$

$$0<n_{Ga1C}/(n_{Al1C}+n_{Ga1C})\leq 1.$$

Advantageous Effect

According to the present disclosure, it is possible to provide an infrared detecting device having better SNR characteristics.

BRIEF DESCRIPTION OF THE DRAWINGS

In the accompanying drawings:

FIG. 6 illustrates cross-sectional TEM analysis results of three samples of Example 6 and a sample to be compared. The lower row indicates the line defect density (lines/cm$^2$) of the light receiving layer obtained from the results of plane-view TEM analysis conducted on the three samples of Example 6 and the sample to be compared.

FIG. 7 illustrates cross-sectional TEM analysis results of the three samples of Example 6 and the sample to be compared. The lower row indicates the line defect density (lines/cm$^2$) of the light receiving layer obtained from the results of plane-view TEM analysis conducted on the three samples of Example 6 and the sample to be compared.

DETAILED DESCRIPTION

Figure 1:
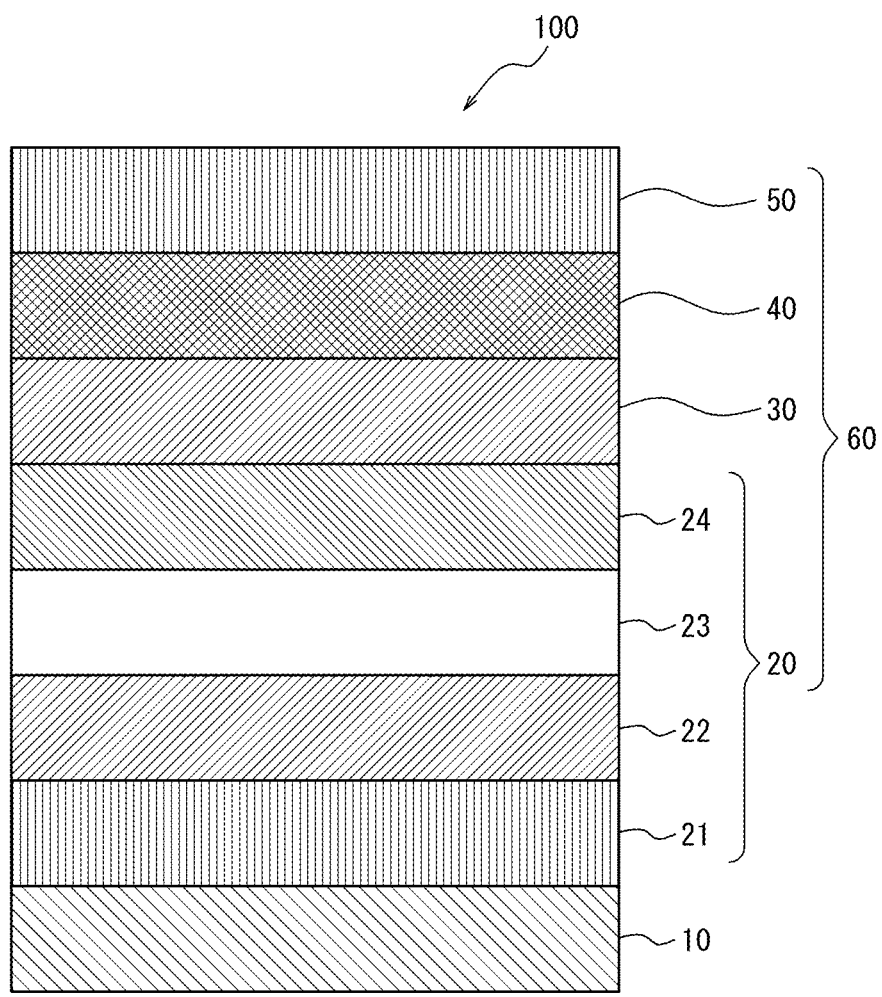
FIG. 1 is a cross-sectional view illustrating a configuration of an infrared light detecting device according to a first embodiment.

Numerous specific configurations will be described in detail below in order to provide a thorough understanding of embodiments of the present disclosure. It will be apparent, however, that other embodiments may be devised without being limited to the disclosed configurations. In addition, the following embodiments do not limit the aspects and concepts of this disclosure defined by the claims, but include all of the combinations of characteristic configurations described in the embodiments.

<Infrared Detecting Device>

The following provides a description of infrared detecting devices in first and second aspects.

An infrared detecting device according to the first aspect comprises: a semiconductor substrate; a first compound semiconductor layer formed on the semiconductor substrate and having a first conductivity type; a light receiving layer formed on the first compound semiconductor layer and containing at least In and Sb, where the light receiving layer has an Al composition at a proportion of nlight [%] in all group III elements in the light receiving layer where $0 \leq n_{light} < 18$; a third compound semiconductor layer formed on the light receiving layer and having a second conductivity type; and a second compound semiconductor layer formed in at least one of regions between the light receiving layer and the third compound semiconductor layer or between the first compound semiconductor layer and the light receiving layer, containing at least In, Al, and Sb, having an Al composition at a proportion of $n_2$ [%] in all group III elements in the second compound semiconductor layer where $0 < n_2 < 100$, and having a film thickness of $m_2$ [nm] where $m_2 > 2$, wherein the first compound semiconductor layer comprises, in the stated order: a first A layer containing at least In and Sb and having an Al composition at a proportion of $n_{1A}$ [%] in all group III elements in the first A layer where $0n_{1A} < 18$; a first B layer containing at least In and Sb, having an Al composition at a proportion of $n_{1B}$ [%] in all group III elements in the first B layer where $0 \leq n_{1B} < 100$, and having a film thickness of $m_{1B}$ [nm]; and a first C layer containing at least In and Sb and having an Al composition at a proportion of $n_{1C}$ [%] in all group III elements in the first C layer where $0 \leq n_{1C} < 18$, where $n_{1A}$, $n_{1B}$, $n_{1C}$, $n_2$, $n_{light}$, $m_{1B}$, and $m_2$ satisfy the following relations:

$$|n_2 - n_{light}| \times m_2 | n_{1B} - n_{1A}| \times m_{1B};$$

$$n_{1B} > n_{1A} \text{ and } n_{1B} > n_{1C}, \text{ or } n_{1B} < n_{1A} \text{ and } n_{1B} < n_{1C}; \text{ and}$$

$$n_2 > n_{light} + 5.$$

Here, the SNR of the infrared detecting device is proportional to the product of a photocurrent Ip generated upon incidence of an infrared ray and the square root of an device resistance R0 of the infrared detecting device. That is, it is expressed as:

$$SNR \propto Ip \sqrt{R0} \quad \text{Expression (1)}$$

Accordingly, by increasing the device resistance R0 without lowering Ip, it is possible to improve the SNR characteristics of the infrared detecting device.

The device resistance R0 of the infrared detecting device is determined by two factors, the above-mentioned diffusion current and the carrier recombination current generated in the infrared detecting device. If the product of the film thickness of the second compound semiconductor layer and the difference in Al composition between the second compound semiconductor layer and the light receiving layer (i.e., $|n_2 - n_{light}| \times m_2$) is sufficiently large, the diffusion current can be sufficiently suppressed. Thus, R0 is determined by the magnitude of the carrier recombination current. The magnitude of the carrier recombination current largely depends on the carrier recombination current through line defects in the vicinity of the second compound semiconductor layer. Therefore, by reducing the line defect density in the vicinity of the second compound semiconductor layer, it is possible to suppress the carrier recombination current and increase the device resistance R0.

For the purpose of reducing the line defect density in the vicinity of the second compound semiconductor layer, it is effective to apply a line defect filter layer (for example, in the first aspect, a first B layer containing at least In and Sb and having an Al composition of $n_{1B}$ [%] where $0 \leq n_{1B} < 100$). The line defect filter layer refers to a layer applied between base materials (for example, in the first aspect, between a first A layer having an Al composition of $n_{1A}$ [%] where $0 \leq n_{1A} < 18$ and a first C layer containing at least In and Sb and having an Al composition of $n_{1C}$ [%] where $0 \leq n_{1C} < 18$) for the purpose of reducing the line defect density. The line defect filter layer selects a material such that its lattice constant is largely different from that of the base materials, and is thinner than the base materials.

The misfit stress generated by the difference in lattice constant between the base materials and the line defect filter layer is concentrated on the thin line defect filter layer such that the line defects bend in the lateral direction (parallel to the main surface of the semiconductor substrate) in the vicinity of the line defect filter layer. In this respect, when a plurality of bending line defects collide with each other, they disappear. Therefore, by applying a line defect filter layer between base materials, propagation of line defects to the upper layer (the light receiving layer in the first aspect) is suppressed.

In order to improve the device resistance R0 of the infrared detecting device, it is necessary to optimize the compositions and film thicknesses of the materials of the first compound semiconductor layer, the second compound semiconductor layer, and the light receiving layer, respectively. However, it is difficult to theoretically obtain the optimum value, and experimental investigation is required to realize the optimization.

As a result of various investigations, we found that one of the design factors important for improving the device resistance R0 of the infrared detecting device is the relation between (1) the product of the film thickness of the second compound semiconductor layer and the difference in Al composition between the second compound semiconductor layer and the light receiving layer (that is, $|n_2 - n_{light}| \times m_2$) and (2) the product of the film thickness of the first B layer and the difference in Al composition between the first B layer and the first A layer (that is, $|n_{1B} \times n_{1A}| \times m_{1B}$); specifically, the relation of $|n_2 - n_{light}| \times m_2 \leq |n_{1B} - n_{1A}| \times m_{1B}$). It is known that the ease of bending of line defects correlates with the "magnitude" of difference in Al composition. Accordingly, the absolute values are used in the expressions indicative of the difference in Al composition.

Here, if $|n_2 - n_{light}| \times m_2$ is sufficiently large, it is expected that the diffusion current suppressing effect can be provided by the second compound semiconductor layer, but if $|n_2 - n_{light}| \times m_2 > |n_{1B} - n_{1A}| \times m_{1B}$ is satisfied, it was found that line defects penetrating without bending in the vicinity of the first B layer are bent in the lateral direction in the vicinity of the second compound semiconductor layer. In this case, it was found that as the line defect density increases in the vicinity of the second compound semiconductor layer, carrier recombination via line defects in the vicinity of the second compound semiconductor layer is promoted, and the device resistance R0 of the infrared detecting device decreases.

With the infrared detecting device of this embodiment, by satisfying $|n_2 - n_{light}| \times m_2 \leq |n_{1B} - n_{1A}| \times m_{1B}$, bending of line defects occurring in the vicinity of the second compound semiconductor layer is suppressed, which makes it possible to reduce the line defect density in the vicinity of the second compound semiconductor layer. Accordingly, carrier recombination via line defects in the vicinity of the second compound semiconductor layer is suppressed, and as a result, the device resistance R0 of the infrared detecting device can be maximized.

As the material of the infrared detecting device, AlInSb capable of providing crystals of relatively good quality can be used. When applying a line defect filter layer (the first B layer in the first aspect) to an infrared detecting device formed using AlInSb, it is preferable to apply a line defect filter layer containing AlInSb which is the same element type from the viewpoint that the refractive index difference is small and the loss due to internal reflection is small, and from the perspective of ease of the device formation process. By applying an AlInSb layer having a different Al composition from the AlInSb layer of the base materials (the first A layer and the first C layer in the first aspect) as a line defect filter layer, a lattice constant difference and a misfit stress are generated, making it possible to cause line defects to bend.

As used herein, although "on" in the expression "a first compound semiconductor layer formed on the semiconductor substrate and having a first conductivity type" indicates that a first compound semiconductor layer having the first conductivity type is formed on the semiconductor substrate, it is also included in this expression that there is another layer between the semiconductor substrate and the first compound semiconductor layer having the first conductivity type. The term "on" used in expressing the relationship between other layers has the same meaning.

As used herein, "containing" in the expression "containing at least In and Sb" indicates that In and Sb are contained in the layer, yet this expression may also include other elements. Specifically, this expression also includes a case where a slight change is made to the composition of this layer by adding a small amount (for example, by adding an element such as Al, As, P, Ga, N, or the like by not more than several percent). The term "containing" used in expressing the composition of other layers has the same meaning.

In addition, "in the . . . layer" in the expression "an Al composition at a proportion of . . . in all group III elements in the . . . layer" indicates a range of each corresponding layer, i.e., "in the first compound semiconductor layer having a first conductivity type", "in the light receiving layer", "in the third compound semiconductor layer having a second conductivity type", "in the second compound semiconductor layer", "in the first A layer", "in the first B layer", and "in the first C layer", respectively, rather than a range of the entire layers described.

Further, from the viewpoint of improving the light intake efficiency, it is preferable that the infrared detecting device according to the first aspect detects infrared rays incident from the semiconductor substrate side rather than from the surface of the semiconductor substrate on which compound semiconductors are deposited where the electrode material is formed.

Hereinafter, each component of the infrared detecting device according to this embodiment will be described with examples.

<Semiconductor Substrate>

The semiconductor substrate of the infrared detecting device according to this embodiment is not particularly limited as long as a first compound semiconductor layer having a first conductivity type to be described later can be stacked thereon. Examples of the semiconductor substrate include, but are not limited to, a GaAs substrate, a Si substrate, an InP substrate, and an InSb substrate. From the viewpoint that crystal growth of a compound semiconductor is easy, a GaAs substrate is preferable.

The surface on which the first compound semiconductor layer is formed is referred to as the main surface of the semiconductor substrate.

The semiconductor substrate is not limited by doping with a donor impurity or an acceptor impurity, yet from the viewpoint of enabling a plurality of independent infrared detecting devices formed on the conductor substrate to be connected in series or in parallel, the semiconductor substrate is desirably semiconductive or insulatable and separatable from compound semiconductor layers.

From the viewpoint of stacking a compound semiconductor single crystal, the semiconductor substrate is preferably a single crystal substrate. The plane orientation of the semiconductor substrate is not particularly limited, yet for example (001), (111), and (101) are desirable. It is also preferable to use a plane orientation inclined by 1° to 5° with respect to these plane orientations.

The surface of the semiconductor substrate may be heated in a vacuum to remove the oxide film, or a contaminant such as an organic substance or a metal may be removed before the semiconductor substrate is subjected to a cleaning treatment with an acid or an alkali.

<First Compound Semiconductor Layer>

The first compound semiconductor layer of the infrared detecting device according to this embodiment is formed on the semiconductor substrate and has a first conductivity type (n type, i type, or p type).

In addition, the first compound semiconductor layer having a first conductivity type comprises, in the stated order: a first A layer containing at least In and Sb and having an Al composition of $n_{1A}$ [%] where $0 \le n_{1A} < 18$; a first B layer containing at least In and Sb, having an Al composition of $n_{1B}$ [%] where $0 \le n_{1B} < 100$, and having a film thickness of $m_{1B}$ [nm]; and a first C layer containing at least In and Sb and having an Al composition of $n_{1C}$ [%] where $0 \le n_{1C} < 18$, wherein the following relations are satisfied: $n_{1B} > n_{1A}$ and $n_{1B} > n_{1C}$, or $n_{1B} < n_{1A}$ and $n_{1B} > n_{1C}$.

In addition, the first compound semiconductor layer and a second compound semiconductor layer and a light receiving layer, which will be described later, satisfy $|n_2 - n_{light}| \times m_2 \le |n_{1B} - n_{1A}| \times m_{1B}$.

(Measurement Method of Al Composition of Each Layer)

The Al composition of each layer of the first compound semiconductor layer can be obtained as follows by Secondary Ion Mass Spectrometry (SIMS) method. For the measurement, a magnetic field type SIMS apparatus IMS 7f manufactured by CAMECA may be used. In this method, compositional analysis is performed by irradiating a solid surface with beam type primary ion species, digging in the depth direction by means of sputtering phenomenon, and simultaneously detecting the generated secondary ions. As used herein, the Al composition refers to the ratio of Al element to all group III elements (13 group elements) contained in each layer.

Specifically, cesium ion (Cs+) is used as the primary ion species, the primary ion energy is set to 2.5 keV, and the beam incident angle is set to 67.2°. Under these conditions, MCs+ (M is Al, Ga, In, As, Sb, or the like) with a small matrix effect can be detected as the secondary ion species to be detected.

At this time, sputtering is carried out under the above-mentioned conditions and up to the depth of the target layer for a predetermined period of time to analyze the composition of the target layer. The depth of the target layer can be obtained from the thickness of each layer by cross sectional TEM measurement as described later. For the sputtering time-depth conversion in SIMS analysis, sputtering rate is obtained by measuring the sputtering depth for a certain period of time under the same condition as the analysis by using, for example, a stylus profilometer, and used to convert the sputtering time at the time of sample measurement into depth.

Then, from the signal intensity of MCs+ in each layer, the Al composition was obtained. For example, in the case of an AlInSb layer, the Al composition was obtained from: (signal intensity of AlCs+)/((signal intensity of AlCs+)+(signal intensity of InCs+)).

Even if each layer has a uniform composition in the depth direction, the signal intensity sometimes distributes in the depth direction due to the influence of sputtering. In this case, the signal intensity of each layer is represented by the maximum signal intensity.

Note that the quantitative value of the Al composition obtained by the analysis can be accompanied by deviation from the true value. In order to correct this deviation from the true value, a separate sample for which the lattice constant value obtained from the X-ray diffraction (XRD) method has been obtained is prepared, and, using this sample as a standard sample whose Al composition value is already known, SIMS analysis is performed under the measurement conditions for the Al composition of each layer of the first compound semiconductor layer, and the sensitivity coefficient of the Al composition with respect to the signal intensity can be obtained. The Al composition of each layer of the first compound semiconductor layer can be obtained by multiplying the SIMS signal intensity in each layer of the first compound semiconductor layer by the sensitivity coefficient.

In this case, as a separate sample, $Al_xIn_{1-x}Sb$ having a film thickness of 800 nm stacked on a GaAs substrate can be used. For this sample, a lattice constant may be obtained by X-ray diffraction (XRD) method using an X-ray diffractometer X'Pert MPD manufactured by Spectris Co., Ltd., as described below to determine the Al composition x as a standard sample.

By performing 2θ-ω scan by X-ray diffraction, the lattice constant in the direction normal to the substrate surface of the first A layer can be obtained from the peak position in the 2θ-ω scan of the plane index of the plane corresponding to the plane orientation of the substrate surface, and the Al composition x can be determined from the lattice constant in the normal direction using the Vegard's rule. In this case, it is assumed that there is no anisotropic distortion of the $Al_xIn_{1-x}Sb$ layer. Specifically, the Vegard's rule is represented by:

$$a_{AlInSb} = x a_{AlSb} + (1-x) a_{InSb} \quad \text{Expression (2)}$$

Where $a_{AlSb}$ is the lattice constant of AlSb, $a_{InSb}$ is the lattice constant of InSb, and $a_{AlInSb}$ is the lattice constant of the $Al_xIn_{1-x}Sb$ layer obtained by the above-described X-ray diffraction. For $a_{AlSb}$, 6.1355 Å may be used and 6.4794 Å for $a_{InSb}$.

As a standard sample for SIMS measurement, a sample with 0.10<x<0.15 may be used.

(Measurement Method of Composition of Elements Other than Al in Each Layer)

The composition of elements other than Al in each layer of the first compound semiconductor layer can also be measured by using the same method as described above.

For example, the Ga composition in the case of containing Ga can also be measured by using the same method as described above.

In this case, $Ga_gIn_{1-g}Sb$ having a film thickness of 800 nm stacked on a GaAs substrate is used as a separate sample. Using $Ga_gIn_{1-g}Sb$, the Vegard's rule is specifically expressed by:

$$a_{GaInSb} = g a_{GaSb} + (1-g) a_{InSb} \quad \text{Expression (3)}$$

Where $a_{GaSb}$ is the lattice constant of GaSb, $a_{InSb}$ is the lattice constant of InSb, and $a_{GaInSb}$ is the lattice constant of $Al_gIn_{1-g}Sb$ obtained by the above-described X-ray diffraction. We used 6.0959 Å for $a_{GaSb}$ and 6.4794 Å for $a_{InSb}$. As a standard sample for SIMS measurement, a sample with 0.10<g<0.15 was used.

The composition of elements other than Al in each layer other than the first compound semiconductor layer can also be measured by using the same method.

(Measurement Method of Film Thickness of Each Layer)

The film thickness of each layer of the first compound semiconductor layer can be measured by cross-sectional TEM (Transmission Electron Spectroscopy) method. Specifically, a sample having a thickness of about 500 nm or less was prepared by FIB method using an FIB apparatus (FB-2100) manufactured by Hitachi High-Technologies Corporation, sectional images were observed in transmission images at an acceleration voltage of 200 kV using an STEM apparatus (HD-2300A) manufactured by Hitachi, Ltd., and the thickness of each layer was measured. The film thicknesses of the layers other than the first compound semiconductor layer can be similarly measured by using the same measurement method.

From the viewpoint of applying the stress necessary for bending of line defects, the lower limit of the film thickness $m_{1A}$ [nm] of the first A layer is preferably 2 nm or more, and more preferably 5 nm or more.

For the film thickness $m_{1A}$ of the first A layer, from the viewpoint of absorbing the misfit stress, it is preferable that $m_{1A} \geq 200$ nm, and more preferable that $m_{1A} \geq 300$ nm. The same range is also preferable for the film thickness $m_{1C}$ of the first C layer.

Further, from the viewpoints of increase in the film formation time and ease of the device formation process, it is preferable that $m_{1A} \leq 700$ nm, and particularly preferable that $m_{1A} \leq 600$ nm. The same range is also preferable for $m_{1C}$.

From the viewpoint of improving the sensitivity to infrared rays in the 3.3 μm band, the Al composition $n_{1A}$ of the first A layer is preferably 8 or more, and more preferably 9 or more. From the same viewpoint, it is preferably 12 or less, and more preferably 11 or less. Similarly, the Al composition $n_{1C}$ of the first C layer is preferably 8 or more, and more preferably 9 or more. Similarly, it is preferably 12 or less, and more preferably 11 or less. As a result, the lattice constant difference from the light receiving layer is reduced, and the crystallinity of the light receiving layer can be improved. Since this wavelength band overlaps with the absorption wavelength band of methane, it is suitable as an infrared detecting device for a methane gas sensor.

From the viewpoint of improving the sensitivity to infrared rays in the 4.3 μm band, the Al composition $n_{1A}$ of the first A layer is preferably 4 or more, and more preferably 5 or more. From the same viewpoint, it is preferably 8 or less, and more preferably 7 or less. Similarly, the Al composition $n_{1C}$ of the first C layer is preferably 4 or more, and more preferably 5 or more. Similarly, it is preferably 8 or less, and more preferably 7 or less. As a result, the lattice constant difference from the light receiving layer is reduced, and the crystallinity of the light receiving layer can be improved. Since this wavelength band overlaps with the absorption wavelength band of $CO_2$, it is suitable as an infrared detecting device for a $CO_2$ gas sensor.

From the viewpoint of uniformly applying stress to the first B layer, it is preferable that $|n_{1A} - n_{1C}| < 10$, and more preferable that $|n_{1A} - n_{1C}| < 3$.

From the viewpoint of reducing crystal defects, it is preferable that the Al composition $n_{1A}$ of the first A layer, the Al composition $n_{1C}$ of the first C layer, and the Al composition $n_{light}$ of the light receiving layer are the same.

It is preferable that the first compound semiconductor layer has a layered structure in which a first A layer, a first B layer, and a first C layer are sequentially stacked on top of one another in the stated order for a number of repetitions i. Specifically, in the layered structure, the first A layer$_{(1)}$→the first B layer$_{(1)}$→the first C layer$_{(1)}$→the first A layer$_{(2)}$→the first B layer$_{(2)}$→the first C layer$_{(2)}$→ . . . → the first A layer$_{(i)}$→the first B layer$_{(i)}$→the first C layer$_{(i)}$→ . . . and so on are stacked on top of each other in the stated order. In this case, the composition and film thickness are preferably the same for the first A layers$_{(k)}$ (k=1, 2, . . . , i). Similarly, the composition and film thickness are preferably the same for the first B layers$_{(k)}$ (k=1, 2, . . . , i). Similarly, the composition and film thickness are preferably the same for the first C layers$_{(k)}$ (k=1, 2, . . . , i). Also, the compositions of the first C layer$_{(k)}$ and the first A layer$_{(k+1)}$ are preferably the same. In addition, the first C layer$_{(k)}$ and the first A layer$_{(k+1)}$ may be integrated.

In this case, the number of repetitions i is preferably i≥2, and more preferably i≥3 from the viewpoint of reducing the line defect density.

From the viewpoints of increase in the film formation time and ease of the device formation process, it is preferable that i≤6, and more preferable that i≤5.

Besides the above-mentioned layered structure in which first A layers, first B layers, and first C layers are stacked in the stated order, examples of the material of the first compound semiconductor layer may include AlAs, GaAs, InAs, AlSb, GaSb, InSb, or InP alone, a single layer of a mixed crystal thereof, or a layered structure thereof.

In the case where the above-described semiconductor substrate is a GaAs substrate, a layer in contact with the GaAs substrate in the first compound semiconductor layer is preferably an InSb layer. In other words, it is preferable that the first A layer closest to the GaAs substrate in the first compound semiconductor layer is formed in contact with the InSb layer.

The first compound semiconductor layer is preferably n- or p-type doped with a donor impurity or an acceptor impurity, but it may not necessarily be doped as long as it has a first conductivity type. In the case where the first compound semiconductor layer is doped, the doping concentration is preferably $1 \times 10^{18}$ [cm$^{-3}$] or more from the viewpoint of reducing the contact resistance with the metal (electrode), and it is desirably $1 \times 10^{19}$ [cm$^{-3}$] or less from the viewpoint of securing crystallinity.

The first conductivity type is preferably of n conductivity type from the viewpoint of current diffusion of the infrared light emitting device and improvement of infrared transmittance by the Burstein-Moth effect.

<Second Compound Semiconductor Layer>

The second compound semiconductor layer of the infrared detecting device according to this embodiment is formed on the first compound semiconductor layer and has an n-, i-, or p-conductivity type.

The second compound semiconductor layer contains at least In, Al, and Sb, has an Al composition of $n_2$ [%] ($0 < n_2 < 100$), a film thickness of $m_2$ [nm] ($m_2 > 2$), and satisfies a relation of $n_2 > n_{light} + 5$.

Figure 3:
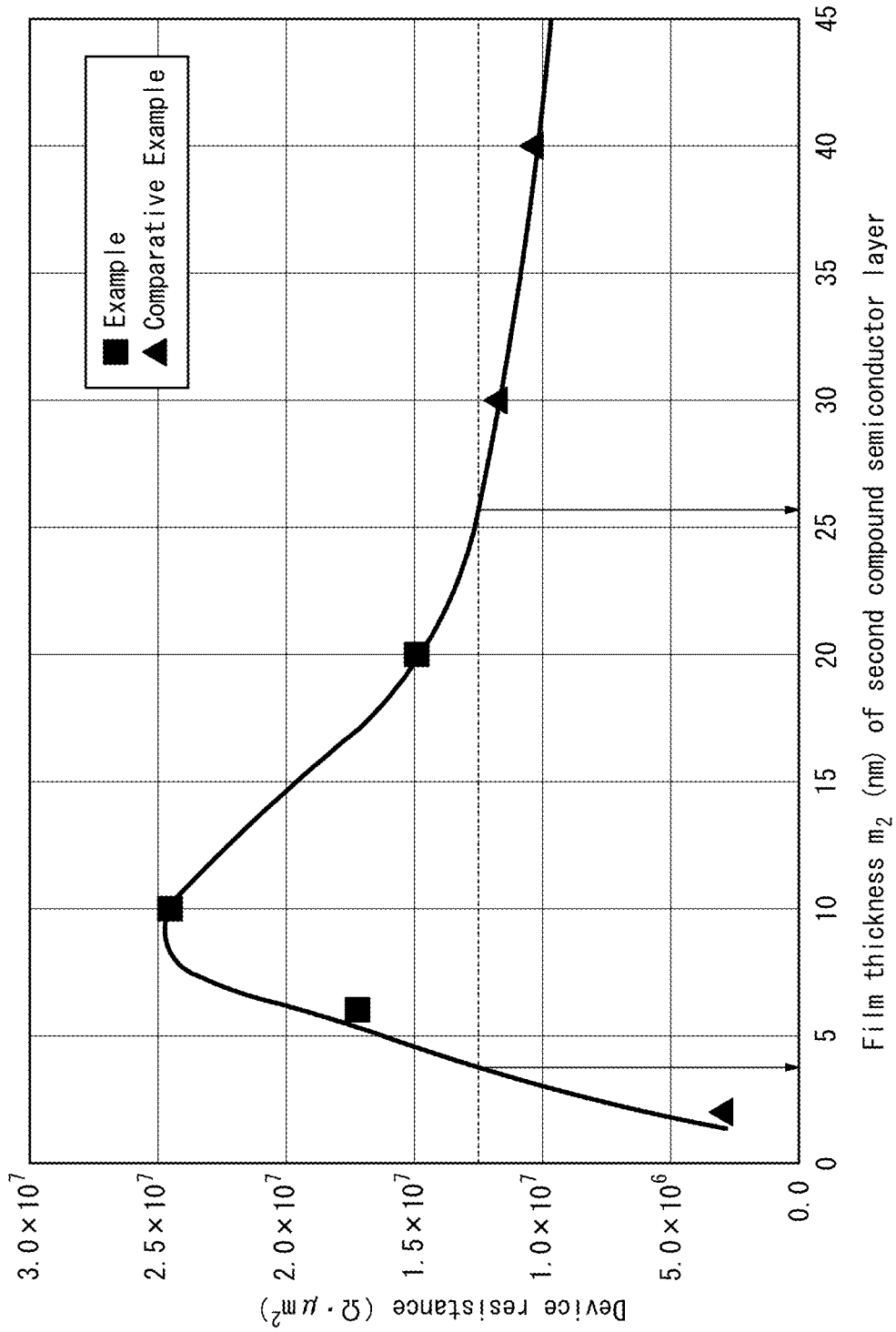
FIG. 3 is a graph illustrating the measured values of device resistance of infrared detecting devices of Examples 1, 2, 3 and Comparative Examples 1, 2, 3. In the figure, the curve connecting the plots indicates the curve obtained by curve fitting. In the figure, the broken line indicates the device resistance of $1.25 \times 10^7$ ($\Omega \cdot \mu m^2$), and the arrow indicates the film thickness $m^2$ (mm) of the second compound semiconductor layer at the intersection of the curve and the broken line.
Figure 4:
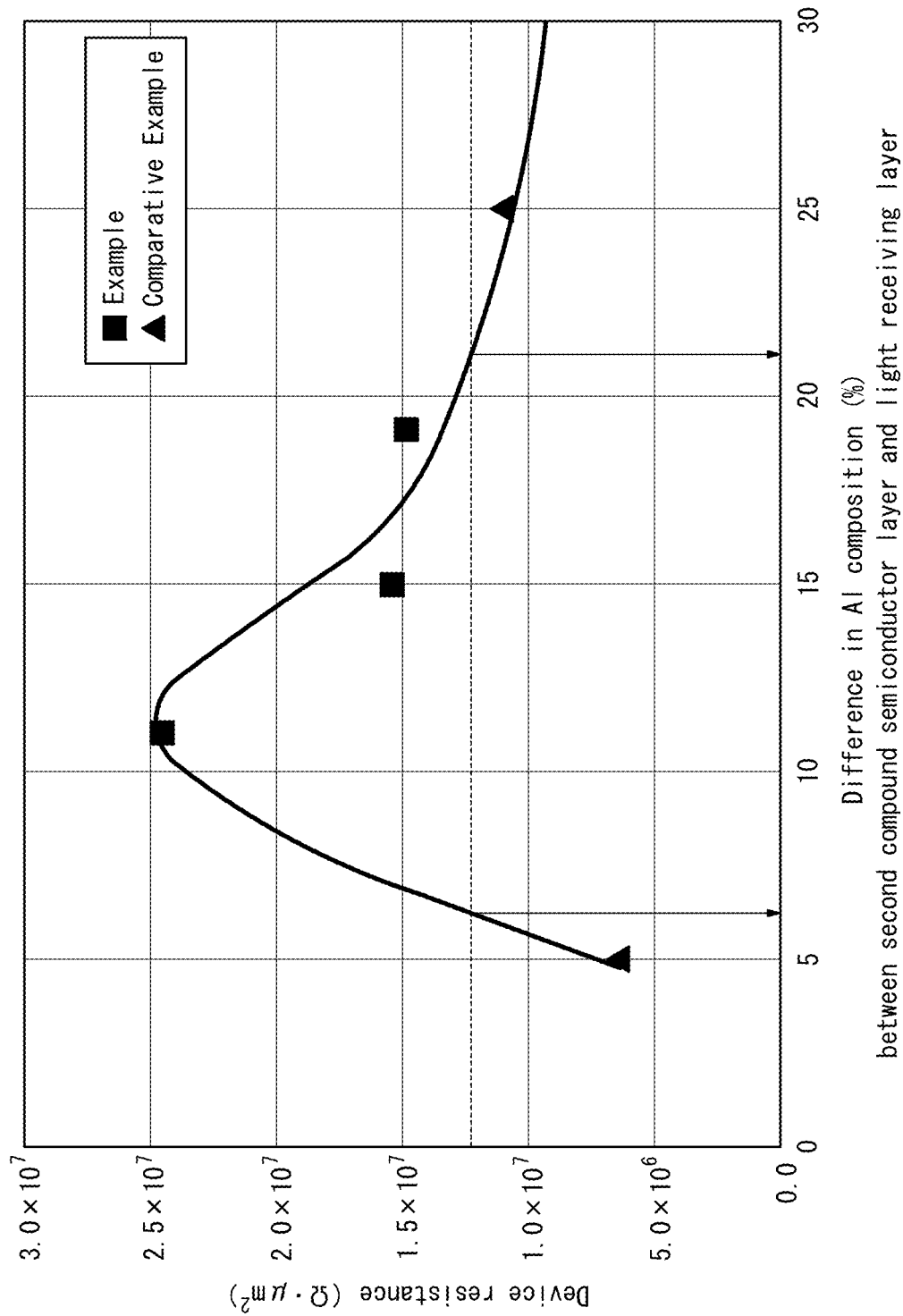
FIG. 4 is a graph illustrating the measured values of device resistance of infrared detecting devices of Examples 1, 4, 5 and Comparative Examples 4, 5. In the figure, the curve connecting the plots indicates the curve obtained by curve fitting. In the figure, the broken line indicates the device resistance of $1.25 \times 10^7$ ($\Omega \cdot \mu m^2$), and the arrow indicates the difference in Al composition between the second compound semiconductor layer and the light receiving layer at the intersection of the curve and the broken line.

Here, as illustrated in FIGS. 3 and 4, when the film thickness is $m_2$ [nm] ($m_2 > 2$) and the Al composition $n_2$ satisfies a relation of $n_2 > n_{light} + 5$, it is possible to prevent tunneling of the diffusion current which would otherwise cause a deterioration in SNR (a phenomenon that the diffusion current generated in the light receiving layer passes through the second compound semiconductor layer and flows into the first compound semiconductor). From the viewpoint of suppressing the decrease in R0, which is caused by the tunnel current generated as a result of $n_2$ being too small, to be 50% or less as compared to the case where $n_2$ is the optimum value, it is more preferable that $n_2 > n_{light} + 7$ and that $m_2$ is 4 nm or more in view of the lower limits of $n_2$ and $m_2$ in FIGS. 3 and 4.

Further, from the viewpoint of suppressing the decrease in R0, which is caused by a line defect penetrating the first B layer bending in the vicinity of the second compound semiconductor layer, to be 50% or less as compared to the case where $|n_2 - n_{light}| \times m_2$ is the optimum value, it is preferable to satisfy a relation of $|n_2 - n_{light}| \times m_2 \leq 572$ in view of the product of the upper limit of $n_2$ and the upper limit of $m_2$ in FIGS. 3 and 4.

The material of the second compound semiconductor layer is not particularly limited as long as it is a compound semiconductor containing at least In and Sb and has an Al composition that satisfies $n_{light}$ [%] ($0 \leq n_{light} < 100$).

As can be seen from FIGS. 3 and 4, in terms of obtaining a favorable device resistance (for example, $1.25 \times 10^7$ Ω·μm$^2$ or more), $m_2$ is preferably 4 nm to 26 nm, and more preferably 6 nm to 15 nm, and the difference in Al composition between the second compound semiconductor layer and the light receiving layer is preferably 7% to 21%, and more preferably 8% to 15%.

<Light Receiving Layer>

The light receiving layer in the infrared detecting device according to this embodiment is formed on the second compound semiconductor layer, contains at least In and Sb, and has an Al composition of $n_{light}$ [%] ($0 \leq n_{light} < 18$).

From the viewpoint of improving the sensitivity to infrared light in the 3.3 μm band, the Al composition $n_{light}$ of the light receiving layer is preferably 8 or more, and more preferably 9 or more. From the same viewpoint, it is preferably 12 or less, and more preferably 11 or less. Since this wavelength band overlaps with the absorption wavelength band of methane, it is suitable as an infrared detecting device for a methane gas sensor.

From the viewpoint of improving the sensitivity to infrared rays in the 4.3 μm band, the Al composition $n_{light}$ of the light receiving layer is preferably 4 or more, and more preferably 5 or more. From the same viewpoint, it is preferably 8 or less, and more preferably 7 or less. Since this wavelength band overlaps with the absorption wavelength band of $CO_2$, it is suitable as an infrared detecting device for a $CO_2$ gas sensor.

The material of the light receiving layer is not particularly limited as long as it is a compound semiconductor having a band gap corresponding to infrared rays having a wavelength of 2 μm or more.

The conductivity type of the light receiving layer may be n, i, or p type. As for doping, the light receiving layer may be non-doped (that is, it does not contain impurities), or may be n- or p-type doped with a donor impurity or an acceptor impurity.

From the viewpoint of preventing overflow of electrons and holes at the time of voltage application, the lower limit of the film thickness of the light receiving layer is preferably 10 nm or more, and more preferably 20 nm or more.

The upper limit of the film thickness of the light receiving layer is preferably 4000 nm or less, and more preferably 3000 nm or less, from the viewpoints of increase in the film formation time and ease of the device formation process.

<Layer Having Second Conduction Type>

The layer having a second conductivity type of the infrared detecting device according to this embodiment is formed on the light receiving layer and has a second conductivity type (n, i, or p type).

It is preferable that the layer having a second conductivity type preferably has a conductivity type opposite to that of the first conductivity type of the first compound semiconductor layer. For example, if the first compound semiconductor layer is n type, the layer having a second conductivity type is preferably of p type, and if the first compound semiconductor layer is p type, the layer having a second conductivity type is of n type.

As described above, since it is preferable that the first compound semiconductor layer be of n type, the layer having a second conductivity type is preferably of p type.

The layer having a second conductivity type is preferably n- or p-type doped with a donor impurity or an acceptor impurity, but it may not necessarily be doped as long as it has a second conductivity type.

In the case where the layer having a second conductivity type is doped, the doping concentration is preferably $1 \times 10^{18}$ [cm$^{-3}$] or more from the viewpoint of reducing the contact resistance with the metal (electrode), and it is preferably $1\times10^{19}$ [cm$^{-3}$] or less from the viewpoint of securing crystallinity.

The material of the layer having a second conductivity type is not particularly limited as long as it is a compound semiconductor. Examples thereof may include AlAs, GaAs, InAs, AlSb, GaSb, InSb, or InP alone, a single layer of a mixed crystal thereof, or a layered structure thereof.

In the case where the layer having a second conductivity type is in direct contact with the light receiving layer, the material of the layer in contact with the light receiving layer in the layer having a second conductivity type is preferably a material having a larger band gap than the light receiving layer from the viewpoint of improving an effect of confining carriers in the light receiving layer.

From the viewpoint of preventing damage during the device formation process, the lower limit of the film thickness [nm] of the layer having a second conductive type is preferably 30 nm or more, and more preferably 50 nm or more. The upper limit of the film thickness [nm] of the layer having a second conductivity type is preferably 2000 nm or less, and more preferably 1000 nm or less, from the viewpoints of increase in the film formation time and ease of the device formation process.

From the viewpoint of further preventing tunneling of the diffusion current, the second compound semiconductor layer is preferably formed in both of regions between the light receiving layer and the third compound semiconductor layer and between the first compound semiconductor layer and the light receiving layer.

In an embodiment of the present disclosure, each of the compound semiconductor layers (for example, the first compound semiconductor layer, the light receiving layer, and the second compound semiconductor layer) can be formed by using various film forming methods. For example, preferable methods are a molecular beam epitaxy (MBE) method and a metal organic vapor phase epitaxy (MOVPE) method. Each of these methods can be used to form each compound semiconductor layer on the semiconductor substrate. In the step of forming each compound semiconductor layer, the semiconductor substrate may be once taken out from the film forming apparatus into the atmosphere during the formation of each layer constituting the corresponding compound semiconductor layer.

<Layered Structure>

In an embodiment of the present disclosure, the infrared detecting device has the following layered structure.

A first compound semiconductor layer 20 comprises a structure in which at least a first A layer, a first B layer, and a first C layer according to claim 1 are stacked on top of one another in the stated order.

In this case, the first B layer functions as a line defect filter layer, and the first A layer and the first C layer function as a buffer layer that absorbs the misfit stress. By giving a misfit stress to the first B layer, line defects are caused to bend at the interfaces between the first A layer and the first B layer and between the first B layer and the first C layer.

Therefore, as the difference in Al composition from the first A layer and the first C layer becomes larger, the misfit stress becomes larger in the first B layer such that line defects are caused to bend more easily. On the other hand, if the difference in Al composition between the first B layer and the first A layer respective the first C layer becomes too large, the crystal can not withstand such excessively large misfit stress, and conversely line defects occur.

Further, as the film thickness $m_{1B}$ of the first B layer becomes thicker, the misfit stress increases, and line defects bend more easily. On the other hand, if the film thickness $m_{1B}$ of the first B layer is too large, the misfit stress becomes so large that the crystal can not withstand the stress, and conversely dislocations occur.

The difference in Al composition between the first B layer and the first A layer, the difference in Al composition between the first B layer and the first C layer, and the film thickness $m_{1B}$ of the first B layer are not independent from one another, and there are suitable ranges.

A second compound semiconductor layer 30 provides the function of suppressing the diffusion current as described above if the following relations are satisfied:

$m_2>2$; and $n_2>n_{light}+5$.

On the other hand, as the difference in Al composition between the second compound semiconductor layer and the light receiving layer becomes larger, line defects penetrating through the first compound semiconductor layer without bending and reaching the second compound semiconductor layer bend more easily in the vicinity of the second compound semiconductor layer, carrier recombination via these line defects in the vicinity of the second compound semiconductor layer is promoted, and the device resistance R0 of the infrared detecting device is lowered.

Further, as the film thickness $m_2$ of the second compound semiconductor layer is increased, line defects penetrating through the first compound semiconductor layer without bending and reaching the second compound semiconductor layer bend more easily in the vicinity of the second compound semiconductor layer, carrier recombination via these line defects in the vicinity of the second compound semiconductor layer is promoted, and the device resistance R0 of the infrared detecting device is lowered.

The difference in Al composition between the second compound semiconductor layer and the light receiving layer, the difference in Al composition between the first B layer and the first A layer, and the film thickness $m_2$ of the second compound semiconductor layer are not independent from each other, and there are suitable ranges as described above.

The following describes embodiments of the disclosure with reference to the drawings. However, in the drawings described below, the same reference numerals are given to the corresponding portions, and the description thereof will be omitted as appropriate in the overlapping portions. The embodiments of the present disclosure are merely illustrative of a configuration for embodying the technical idea of the disclosure, but are not intended to limit the material, shape, structure, arrangement, dimension, and the like to those disclosed herein. In addition, the following embodiments include all of the combinations of characteristic configurations described herein. Various modifications can be made to the technical idea of the present disclosure within the technical scope defined by the claims.

Hereinafter, first and second embodiments of the infrared detecting device according to the first aspect will be described in detail with reference to the drawings.

FIG. 1 is a cross-sectional view illustrating the configuration of a first embodiment of the infrared detecting device 100 according to the disclosure. The infrared detecting device 100 has a structure in which a compound semiconductor layer 60 is stacked on a semiconductor substrate 10. The compound semiconductor layer 60 has a structure in which a first compound semiconductor layer 20, a second compound semiconductor layer 30, a light receiving layer 40, and a layer 50 having a second conductivity type are stacked on top of one another in the stated order. In the first embodiment, the first compound semiconductor layer 20 comprises a first A layer 22 containing at least In and Sb and having an Al composition of $n_{1A}$ [%] ($0 \leq n_{1A} < 18$). In addition, the first compound semiconductor layer 20 comprises a first B layer 23 containing at least In and Sb and having an Al composition of $n_{1B}$ [%] ($0 \leq n_{1B} < 100$). In addition, the first compound semiconductor layer 20 comprises a first C layer 24 containing at least In and Sb and having an Al composition of $n_{1C}$ [%] ($0 \leq n_{1C} < 18$). In the first embodiment, the first compound semiconductor layer 20 has a structure in which a set of layers, namely a first A layer, a first B layer, and a first C layer are stacked in the stated order.

In this case, the first compound semiconductor layer 20 further comprises a layer containing InSb (InSb layer 21). As illustrated in FIG. 1, the first compound semiconductor layer 20 has a structure in which the first A layer 22 is stacked directly on the InSb layer 21. Further, in the first embodiment, the infrared detecting device 100 has a structure in which the second compound semiconductor layer is stacked directly on the first C layer.

Figure 2:
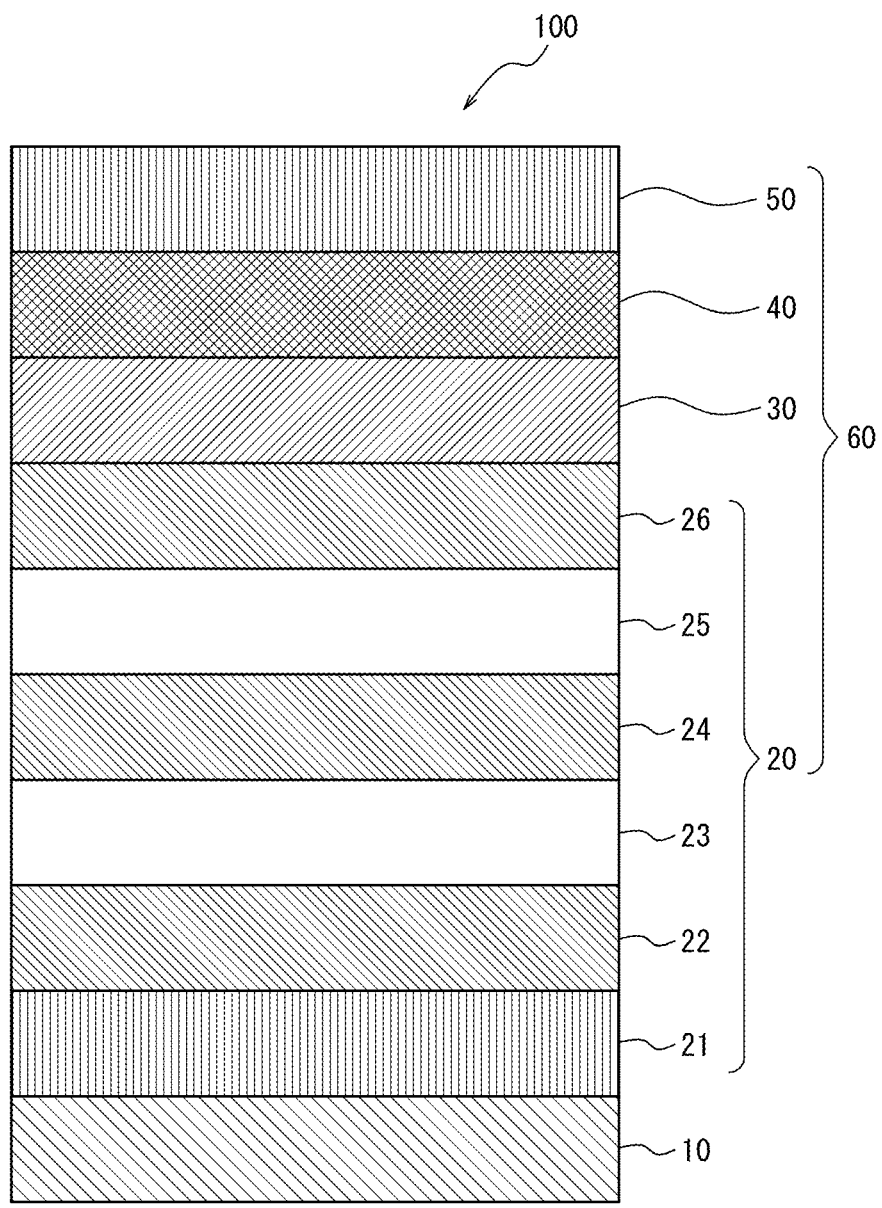
FIG. 2 is a cross-sectional view illustrating a configuration of an infrared light detecting device of a second embodiment.

FIG. 2 is a cross-sectional view illustrating the configuration of a second embodiment of the infrared detecting device 100 according to the disclosure. In the second embodiment, the first compound semiconductor layer 20 has a structure where the number of repetitions i for the above layered structure is 2. In FIG. 2, the same reference numerals are given to the same components as those of the first embodiment of the infrared detecting device 100, and the description thereof will be omitted.

In the second embodiment, the first compound semiconductor layer 20 comprises a first D layer 25 containing at least In and Sb and having an Al composition of $n_{1D}$ [%] ($0 \leq n_{1D} < 100$). In addition, the first compound semiconductor layer 20 comprises a first E layer 26 containing at least In and Sb and having an Al composition of $n_{1E}$ [%] ($0 \leq n_{1E} < 18$). In the second embodiment, the infrared detecting device 100 has a structure in which the second compound semiconductor layer is stacked directly on the first E layer.

Although the first and second embodiments of the present disclosure have been described above, the technical scope of the disclosure is not limited to the scope disclosed herein. For example, the number of repetitions i for the layered structure is not limited to 2, and may be selected within the range of 3 to 6. It will be readily apparent to those skilled in the art that various modifications or improvements can be added to the above embodiments. It will be appreciated that the claims cover all such modifications or improvements as fall within the technical scope of the present disclosure.

Hereinafter, the second embodiment of the infrared detecting device will be described.

An infrared detecting device according to the second aspect comprises: a semiconductor substrate; a first compound semiconductor layer formed on the semiconductor substrate and having a first conductivity type; a light receiving layer formed on the first compound semiconductor layer, containing at least In and Sb, and having an Al composition at a proportion of $n_{Al\ light}$ [%] in all group III elements in the light receiving layer and a Ga composition at a proportion of $n_{Ga\ light}$ [%] in all group III elements in the light receiving layer, where a sum of the proportions $n_{Al\ light}$ and $n_{Ga\ light}$ satisfies a relation of $0 < n_{Al\ light} + n_{Ga\ light} < 18$; a third compound semiconductor layer formed on the light receiving layer and having a second conductivity type; and a second compound semiconductor layer formed in at least one of regions between the light receiving layer and the third compound semiconductor layer or between the first compound semiconductor layer and the light receiving layer, containing at least In, Al, and Sb, having an Al composition at a proportion of $n_{Al2}$ [%] in all group III elements in the second compound semiconductor layer where $0 \leq n_{Al2} < 100$ and a Ga composition at a proportion of $n_{Ga2}$ [%] in all group III elements in the second compound semiconductor layer where $0 \leq n_{Ga2} < 100$, and having a film thickness of $m_2$ [nm] where $m_2 > 2$, wherein the first compound semiconductor layer comprises, in the stated order: a first A layer containing at least In and Sb and having an Al composition at a proportion of $n_{Al1A}$ [%] in all group III elements in the first A layer and a Ga composition at a proportion of $n_{Ga1A}$ [%] in all group III elements in the first A layer, where a sum of the proportions $n_{Al1A}$ and $n_{Ga1A}$ satisfies a relation of $0 < n_{Al1A} + n_{Ga1A} < 18$; a first B layer containing at least In and Sb, having an Al composition at a proportion of $n_{Al1B}$ [%] in all group III elements in the first B layer and a Ga composition at a proportion of $n_{Ga1B}$ [%] in all group III elements in the first B layer, where a sum of the proportions $n_{Al1B}$ and $n_{Ga1B}$ satisfies a relation of $0 < n_{Al1B} + n_{Ga1B} < 100$, and having a film thickness of $m_{1B}$ [nm]; and a first C layer containing at least In and Sb and having an Al composition at a proportion of $n_{Al1C}$ [%] in all group III elements in the first C layer and a Ga composition at a proportion of $n_{Ga1C}$ [%] in all group III elements in the first C layer, where a sum of the proportions $n_{Al1C}$ and $n_{Ga1C}$ satisfies a relation of $0 < n_{Al1C} + n_{Ga1C} < 18$, where $n_{Al1A}$, $n_{Ga1A}$, $n_{Al1B}$, $n_{Ga1B}$, $n_{Al1C}$, $n_{Ga1C}$, $n_{Al2}$, $n_{Ga2}$, $n_{Al\ light}$, $n_{Ga\ light}$, $m_{1B}$, and $m_2$ satisfy the following relations:

$$|n_{Al2}+n_{Ga2}-(n_{Al\ light}+n_{Ga\ light})| \times m_2 \leq |n_{Al1B}+n_{Ga1B}-(n_{Al1A}+n_{Ga1A})| \times m_{1B};$$

$$n_{Al1B}+n_{Ga1B} > n_{Al1A}+n_{Ga1A} \text{ and } n_{Al1B}+n_{Ga1B} > n_{Al1C}+n_{Ga1C}, \text{ or } n_{Al1B}+n_{Ga1B} < n_{Al1A}+n_{Ga1A} \text{ and } n_{Al1B}+n_{Ga1B} < n_{Al1C}+n_{Ga1C}; \text{ and}$$

$$n_{Al2}+n_{Ga2} > n_{Al\ light}+n_{Ga\ light}+5.$$

In the first embodiment of the infrared detecting device, the proportion of the Al composition of each layer containing Al is defined, whereas in the second embodiment of the infrared detecting device, the sum of the proportion of the Al composition of each layer containing Al and the proportion of the Ga composition is defined.

Further, the infrared detecting device according to the second aspect also satisfies the following conditions:

$$0 < n_{Ga2}/(n_{Al2}+n_{Ga2}) \leq 1,$$

$$0 < n_{Ga\ light}/(n_{Al\ light}+n_{Ga\ light}) \leq 1,$$

$$0 < n_{Ga1A}/(n_{Al1A}+n_{Ga1A}) \leq 1,$$

$$0 < n_{Ga1B}/(n_{Al1B}+n_{Ga1B}) \leq 1, \text{ and}$$

$$0 < n_{Ga1C}/(n_{Al1C}+n_{Ga1C}) \leq 1.$$

The infrared detecting device according to this aspect may also improve the SNR characteristics by increasing the device resistance R0 without lowering Ip.

Since $Ga_xIn_{1-x}Sb$ or $Al_{x-y}Ga_yIn_{1-x}Sb$ obtained by replacing all or some of the Als in $Al_xIn_{1-x}Sb$ with Ga has a lattice constant close to that of $Al_xIn_{1-x}Sb$ and can generate a stress equivalent to that of $Al_xIn_{1-x}Sb$, it can be used as the material of the line defect filter layer instead of $Al_xIn_{1-x}Sb$.

$Ga_xIn_{1-x}Sb$ or $Al_{x-y}Ga_yIn_{1-x}Sb$ can also be used as the material of the second compound semiconductor layer because adjustment of x and y can also provide the function of suppressing the diffusion current similarly to $Al_xIn_{1-x}Sb$. As described above, since $Ga_xIn_{1-x}Sb$ or $Al_{x-y}Ga_yIn_{1-x}Sb$ has a lattice constant close to that of $Al_xIn_{1-x}Sb$ and generates a stress equivalent to $Al_xIn_{1-x}Sb$, carrier recombination occurs through line defects bent in the vicinity of the second compound semiconductor even when $Ga_xIn_{1-x}Sb$ or $Al_{x-y}Ga_yIn_{1-x}Sb$ is used for the second compound semiconductor layer.

The effect of the present disclosure can be also exhibited in $Ga_xIn_{1-x}Sb$ or $Al_{x-y}Ga_yIn_{1-x}Sb$ obtained by replacing all or some of the Als in $Al_xIn_{1-x}Sb$ with Ga.

The SNR, the device resistance R0, the action and effect of the disclosure, and the like of the infrared detecting device according to the second aspect may be the same as those described for the infrared detecting device according to the first aspect.

Each component of the infrared detecting device according to the second aspect may be configured as follows.

That is, the semiconductor substrate may be configured as in the first embodiment.

The first compound semiconductor layer, the second compound semiconductor layer, the light receiving layer, and the third compound semiconductor layer having a second conductivity type may be configured as in the first aspect in which the proportion of the Al composition of each layer containing Al is defined, except that the sum of the proportion of the Al composition of each layer containing Al and the proportion of the Ga composition is defined in the second aspect as described above. Here, the Al composition of each layer, the composition of elements other than Al in each layer, and the film thickness of each layer may be measured in the same way as in the first aspect. Further, the layered structure of the infrared detecting device may be the same as in the first aspect.

EXAMPLES

The present disclosure is described in detail below based on examples. However, this disclosure is not limited to the following examples. Of course, various modifications are possible without departing from the gist of the disclosure.

Example 1

As illustrated in FIG. 2, the following layers are stacked in the stated order on a semi-insulating GaAs substrate (a semiconductor substrate 10) using an MBE apparatus to form a compound semiconductor layer 60:

an n-type InSb layer 21 doped with Sn at $7 \times 10^{18}$ [cm$^{-3}$] to a thickness of 0.5 μm;

an n-type $Al_{0.08}In_{0.92}Sb$ layer (a first A layer 22) doped with Sn at $7 \times 10^{18}$ [cm$^{-3}$] to a thickness of 0.5 μm;

an n-type $Al_{0.30}In_{0.70}Sb$ layer (a first B layer 23) doped with Sn at $7 \times 10^{18}$ [cm$^{-3}$] to a thickness of 0.02 μm;

an n-type $Al_{0.08}In_{0.92}Sb$ layer (a first C layer 24) doped with Sn at $7-10^{18}$ [cm$^{-3}$] to a thickness of 0.5 μm;

an n-type $Al_{0.30}In_{0.70}Sb$ layer (a first D layer 25) doped with Sn at $7 \times 10^{18}$ [cm$^{-3}$] to a thickness of 0.02 μm;

an n-type $Al_{0.08}In_{0.92}Sb$ layer (a first E layer 26) doped with Sn at $7 \times 10^{18}$ [cm$^{-3}$] to a thickness of 0.5 μm;

an n-type $Al_{0.30}In_{0.70}Sb$ layer (a second compound semiconductor layer 30) doped with Sn at $7 \times 10^{18}$ [cm$^{-3}$] to a thickness of 0.02 μm;

a non-doped $Al_{0.08}In_{0.92}Sb$ layer (a light receiving layer 40) to a thickness of 1 μm;

a p-type $Al_{0.30}In_{0.70}Sb$ layer (a third compound semiconductor layer having a second conductivity type) doped with Zn at $3 \times 10^{18}$ [cm$^{-3}$] to a thickness of 0.02 μm; and a p-type $Al_{0.08}In_{0.92}Sb$ layer (a layer 50 having a second conductivity type) doped with Zn at $3 \times 10^{18}$ [cm$^{-3}$] to a thickness of 0.5 μm.

Then, a resist pattern was formed on the compound semiconductor layer 60, and etching was performed to fabricate a mesa structure. Further, insulating grooves made of silicon oxide are formed between the mesa structures such that the respective light receiving devices are electrically independent, and silicon nitride was formed as an insulating layer on the entire surface of the compound semiconductor layer 60 including the mesa structure and an insulating trench. A contact hole is formed in a part of the insulating layer, and titanium (Ti), platinum (Pt), and gold (Au) are deposited in the stated order so as to cover the contact hole to form an electrode portion, whereby a plurality of serially-connected infrared detecting devices were obtained.

Examples 2 to 5

According to Table 1, the Al composition $n_2$ and film thickness $m_2$ were changed for each second compound semiconductor layer 30.

TABLE 1

| Example | $n_{1A}$ (%) | $n_{1B}$ (%) | $n_{1C}$ (%) | $m_{1B}$ (nm) | $|n_{1B} - n_{1A}|$ (%) | $|n_{1B} - n_{1A}| \times m_{1B}$ | $m_2$ (nm) | $n_2$ (%) | $|n_2 - n_{light}|$ (%) | $|n_2 - n_{light}| \times m_2$ |
|---|---|---|---|---|---|---|---|---|---|---|
| 1 | 8 | 30 | 8 | 20 | 22 | 440 | 20 | 30 | 22 | 440 |
| 2 | 8 | 30 | 8 | 20 | 22 | 440 | 6 | 30 | 22 | 132 |
| 3 | 8 | 30 | 8 | 20 | 22 | 440 | 10 | 30 | 22 | 220 |
| 4 | 8 | 30 | 8 | 20 | 22 | 440 | 20 | 19 | 11 | 220 |
| 5 | 8 | 30 | 8 | 20 | 22 | 440 | 20 | 23 | 15 | 300 |

Comparative Examples 1 to 5

According to Table 2, the Al composition $n_2$ and film thickness $m_2$ were changed for each second compound semiconductor layer 30.

TABLE 2

| Comparative Example | $n_{1A}$ (%) | $n_{1B}$ (%) | $n_{1C}$ (%) | $m_{1B}$ (nm) | $\|n_{1B} - n_{1A}\|$ (%) | $\|n_{1B} - n_{1A}\| \times m_{1B}$ | $m_2$ (nm) | $n_2$ (%) | $\|n_2 - n_{light}\|$ (%) | $\|n_2 - n_{light}\| \times m_2$ |
|---|---|---|---|---|---|---|---|---|---|---|
| 1 | 8 | 30 | 8 | 20 | 22 | 440 | 2  | 30 | 22 | 44  |
| 2 | 8 | 30 | 8 | 20 | 22 | 440 | 30 | 30 | 22 | 660 |
| 3 | 8 | 30 | 8 | 20 | 22 | 440 | 40 | 30 | 22 | 880 |
| 4 | 8 | 30 | 8 | 20 | 22 | 440 | 20 | 13 | 5  | 100 |
| 5 | 8 | 30 | 8 | 20 | 22 | 440 | 20 | 33 | 25 | 500 |

<Measurements of Al Composition and Measurement of Composition of Elements other than Al of Each Layer>

The Al composition of each layer was measured by a secondary ion mass spectrometry (SIMS) method using a magnetic field type SIMS apparatus IMS 7f manufactured by CAMECA. Specifically, cesium ion (Cs+) was used as the primary ion species, the primary ion energy was set to 2.5 keV, and the beam incident angle was set to 67.2°. Under these conditions, MCs+ (M is Al, Ga, In, As, Sb, or the like) with a small matrix effect was detected as the secondary ion species to be detected.

Measurement of the Al composition of each layer was performed using $Al_xIn_{1-x}Sb$ having a film thickness of 800 nm stacked on a GaAs substrate as a replacement sample, and for this sample, the lattice constant was measured by X-ray diffraction (XRD) using an X-ray diffractometer X'Pert MPD manufactured by Spectris Co., Ltd.

Details of the measurement of the Al composition of each layer are as described in the Detailed Description section.

The composition of elements other than Al in each layer was measured in accordance with the measurement of the Al composition of each of the layers described above. Details of the measurement of the composition of elements other than Al in each layer are as described in the Detailed Description section.

<Comparison of Device Resistance>

Device resistance was measured for the infrared detecting devices formed in Examples 1 to 5 and Comparative Examples 1 to 5. Specifically, the value of current flowing when applying a voltage of 5 nV in the forward direction to each of the elements obtained in the examples and comparative examples was measured, then the value of current flowing when applying a voltage of 5 nV in the reverse direction was measured, then it was confirmed that a value proportional to the applied voltage was obtained for the measured current value, and then the result of averaging the measured values of device resistance in the forward and reverse directions was used as the device resistance at the applied voltage near 0 V.

It was confirmed that a higher device resistance can be obtained in the conditions of Examples 1 to 5 in which $m_2$ and $n_2$ satisfy the following relations as compared with Comparative Examples 1 to 5:

$|n_2 - n_{light}| \times m_2 \leq |n_{1B} - n_{1A}| \times m_{1B}$;

$n_{1B} > n_{1A}$ and $n_{1B} > n_{1C}$, or $n_{1B} < n_{1A}$ and $n_{1B} < n_{1C}$; and $n_2 > n_{light} + 5$.

Figure 5:
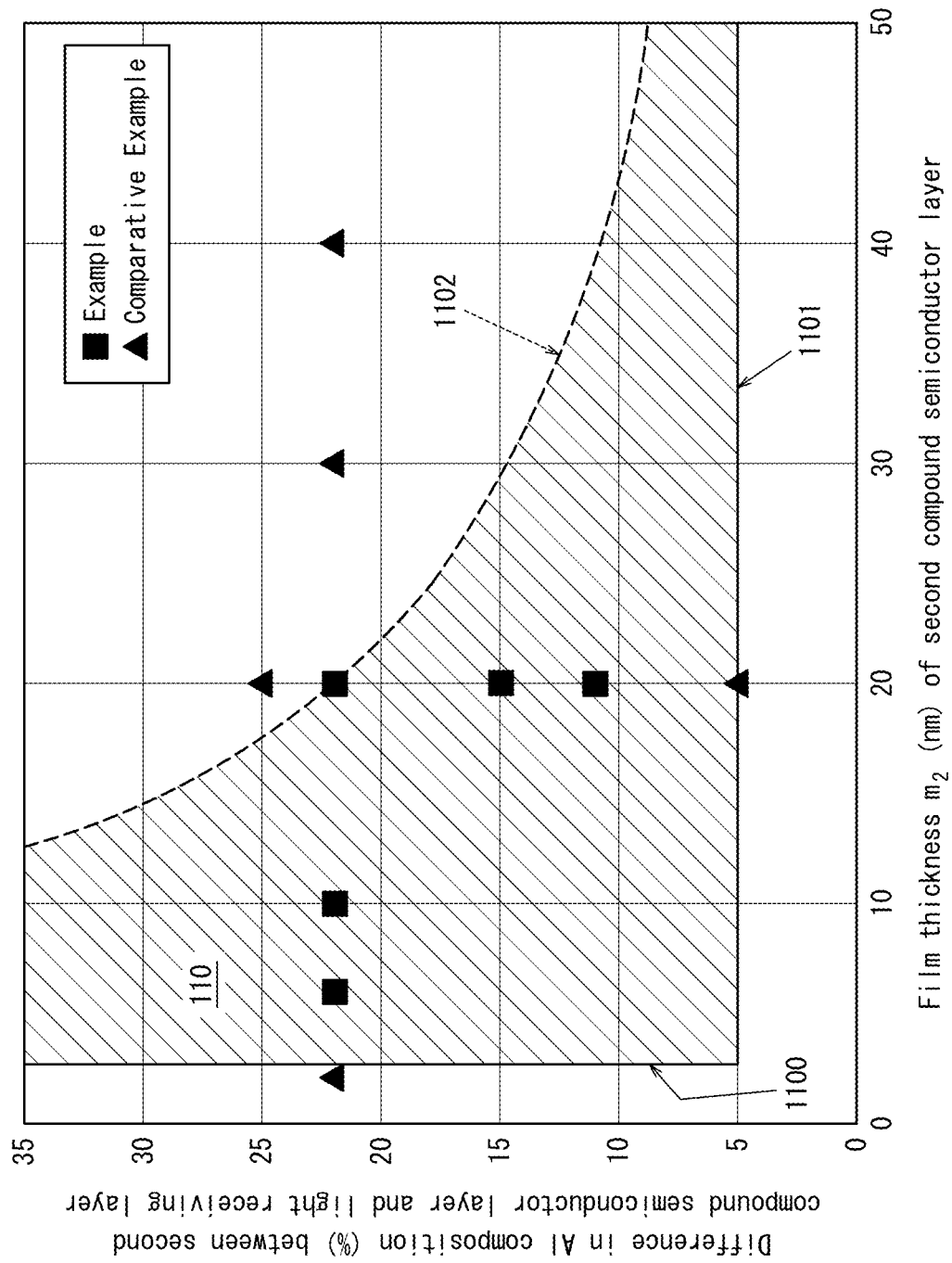
FIG. 5 illustrates a range in which infrared light emitting devices are considered as having good SNR characteristics.

Referring now to FIG. 5, Examples 1 to 5 are compared with Comparative Examples 1 to 5, and the above relations are further investigated. The horizontal axis in FIG. 5 indicates the film thickness $m_2$ [nm] of the second compound semiconductor layer 30. The vertical axis in FIG. 5 indicates the difference in Al composition [%] between the second compound semiconductor layer 30 and the light receiving layer 40. As described above, it is important to satisfy $n_2 > m_{light} + 5$ in order to prevent the diffusion current which would otherwise cause a deterioration in SNR, and furthermore, it is preferable that $m_2 > 2$ is satisfied. First, in FIG. 5, $m_2 > 2$ is satisfied in a region on the right side of a straight line 1100. The magnitude [%] of difference in Al composition between the second compound semiconductor layer 30 and the light receiving layer 40 is $|n_2 - m_{light}|$. That is, in FIG. 5, in a region above a straight line 1101, a relation of $n_{21} > n_{light} + 5$ is satisfied.

Further, in order to prevent line defects penetrating through the first B layer from bending in the vicinity of the second compound semiconductor layer, it is preferable to satisfy a relation of $|n_2 n_{light}| \times m_2 \leq 440$. In FIG. 5, a relation of $|n_2 - n_{light}| \times m_2 \leq 440$ is satisfied within the range not going beyond a curve 1102.

In order to prevent the diffusion current and to prevent line defects penetrating through the first B layer from bending in the vicinity of the second compound semiconductor layer, the infrared detecting device 100 preferably has a configuration such that it falls within a region 110 surrounded by the straight line 1100, the straight line 1101, and the curve 1102. The region 110 does not include points lying on the straight line 1100 and the straight line 1101, but includes points on the curve 1102. As illustrated in FIG. 5, Examples 1 to 5 fall within the region 110. In contrast, Comparative Examples 1 to 5 are out of the region 110.

Preferably, the infrared detecting device 100 included in the region 110 has a predetermined relationship with the characteristics of the line defect filter in the first B layer such that line defects does not bend in the vicinity of the second compound semiconductor layer. In other words, it is preferable to satisfy, like a line defect filter, a relational expression indicating that line defects are prevented from bending in the vicinity of the second compound semiconductor layer. According to the above investigation, this expression is represented by $|n_2 - n_{light}| \times m_2 \leq |n_{1B} - n_{1A}| \times m_{1B}$. As confirmed again with reference to FIG. 5, the infrared detecting device 100 of Examples 1 to 5 satisfying the above relational expression can obtain high device resistance and can further improve the SNR characteristics.

Example 6

The following layers are stacked in the stated order on a semi-insulating GaAs substrate to form a compound semiconductor layer:

an InSb layer to a thickness of 0.5 μm;

a first compound semiconductor layer (a first A layer): an $Al_{0.08}In_{0.92}Sb$ layer to a thickness of 0.5 μm;

a line defect filter layer (a first B layer) to be described later to a thickness of 0.02 μm;
a first compound semiconductor layer (a first C layer): an $Al_{0.08}In_{0.92}Sb$ layer to a thickness of 0.5 μm;
a line defect filter layer (a first D layer) to be described later: $Al_{0.3}In_{0.7}Sb$ layer to a thickness of 0.02 μm;
a first compound semiconductor layer (a first E layer): an $Al_{0.08}In_{0.92}Sb$ layer to a thickness of 0.5 μm;
a second compound semiconductor layer: an $Al_{0.3}In_{0.7}Sb$ layer to a thickness of 0.02 μm;
a light receiving layer: an $Al_{0.08}In_{0.92}Sb$ layer to a thickness of 1 μm;
a second compound semiconductor layer: an $Al_{0.3}In_{0.7}Sb$ layer to a thickness of 0.02 μm; and It was also confirmed from the line defect densities of the light receiving layers of the three samples presented in the lower part of FIG. 6 and the lower part of FIG. 7 that $Al_{0.15}Ga_{0.15}In_{0.7}Sb$ (Example 6b) or $Ga_{0.3}In_{0.7}Sb$ (Example 6c) can still provide the effect of reducing the line defect density of the light receiving layer when used as a line defect filter layer as in the case of using $Al_{0.3}In_{0.7}Sb$ (Example 6a), and can still function as a line defect filter layer even if all or some of the Als are substituted with Ga.

It is understood that the effect of the present disclosure is also exhibited in $Ga_xIn_{1-x}Sb$ or $Al_{x-y}Ga_yIn_{1-x}Sb$ in which all or some of the Als in $Al_xIn_{1-x}Sb$ are replaced with Ga.

<Measurement of Al Composition and Measurements of Composition of Elements other than Al of Each Layer>

TABLE 3

| Example | $n_{Al1A}$/ $n_{Ga1A}$ (%) | $n_{Al1B}$/ $n_{Ga1B}$ (%) | $n_{Al1C}$/ $n_{Ga1C}$ (%) | $m_{1B}$ (nm) | $\|n_{Al1B} + n_{Ga1B} - (n_{Al1A} + n_{Ga1A})\|$ (%) | $\|n_{Al1B} + n_{Ga1B} - (n_{Al1A} + n_{Ga1A})\| \times m_{1B}$ | $m_2$ (nm) | $n_{Al2}$/ $n_{Ga2}$ (%) | $\|n_{Al2} + n_{Ga2} - (n_{Al\,light} + n_{Ga\,light})\|$ (%) | $\|n_{Al2} + n_{Ga2} - (n_{Al\,light} + n_{Ga\,light})\| \times m_2$ |
|---|---|---|---|---|---|---|---|---|---|---|
| 6a | 8/0 | 30/0 | 8/0 | 20 | 22 | 440 | 20 | 30/0 | 22 | 440 |
| 6b | 8/0 | 15/15 | 8/0 | 20 | 22 | 440 | 20 | 30/0 | 22 | 440 |
| 6c | 8/0 | 0/30 | 8/0 | 20 | 22 | 440 | 20 | 30/0 | 22 | 440 | a third compound semiconductor layer having a second conductivity type: an $Al_{0.08}In_{0.92}Sb$ layer to a thickness of 0.5 μm.

As line defect filter layers (a first B layer and a first D layer) to be inserted in the first compound semiconductor layer, three samples using $Al_{0.3}In_{0.7}Sb$, $Al_{0.15}Ga_{0.15}In_{0.7}Sb$, and $Ga_{0.3}In_{0.7}Sb$ were prepared (these samples will also be referred to as Examples 6a, 6b, and 6c, respectively).

As a sample to be compared, one sample was prepared with the following layers stacked in the stated order on a semi-insulating GaAs substrate to form a compound semiconductor layer:
an InSb layer to a thickness of 0.5 μm;
a first compound semiconductor layer (a first A layer): an $Al_{0.08}In_{0.92}Sb$ layer to a thickness of 0.5 μm;
a second compound semiconductor layer: an $Al_{0.3}In_{0.7}Sb$ layer to a thickness of 0.02 μm;
a light receiving layer: an $Al_{0.08}In_{0.92}Sb$ layer to a thickness of 2 μm;
a second compound semiconductor layer: an $Al_{0.3}In_{0.7}Sb$ layer to a thickness of 0.02 μm; and
a third compound semiconductor layer having a second conductivity type: an $Al_{0.08}In_{0.92}Sb$ layer to a thickness of 0.5 μm.

The upper part of FIG. 6 and the upper part of FIG. 7 are cross-sectional TEM analysis results for the three samples in Example 6 and the sample to be compared.

The lower part of FIG. 6 and the lower part of FIG. 7 are tables indicating the line defect density (units: lines/cm²) of the light receiving layer obtained from the results of the plane-view TEM analysis on the three samples in Example 6 and the sample to be compared.

It can be seen from the results of the analysis in the upper part of FIG. 6 and the upper part of FIG. 7 that when any of $Al_{0.3}In_{0.7}Sb$, $Al_{0.15}Ga_{0.15}In_{0.7}Sb$, or $Ga_{0.3}In_{0.7}Sb$ is used as the line defect filter layer, line defects are caused to bend in parallel to the plane direction of the GaAs substrate in the vicinity of the line defect filter layer, which fact provides the effect of reducing the line defect density of the layer above the line defect filter.

<Comparison of Device Resistance>

As a result of measuring the device resistance in the samples of Examples 6a to 6c, it was confirmed that the device resistance was 15 MΩ·μm² in Example 6a, whereas it was 14 MΩ·μm² in Example 6b in which some of the Als in $Al_xIn_{1-x}Sb$ in the line defect filter layer were replaced by Ga, and 15 MΩ·μm² in Example 6c in which all of the Als in $Al_xIn_{1-x}Sb$ in the line defect filter layer were replaced with Ga. In view of the above, even with a device using $Ga_xIn_{1-x}Sb$ or $Al_{x-y}Ga_yIn_{1-x}Sb$ in which all or some of the Als in $Al_xIn_{1-x}Sb$ were replaced with Ga for a line defect filter layer, it is possible to obtain high device resistance and to further improve the SNR characteristics.

The invention claimed is:

1. An infrared detecting device comprising:
   a semiconductor substrate;
   a first compound semiconductor layer formed on the semiconductor substrate and having a first conductivity type;
   a light receiving layer formed on the first compound semiconductor layer and containing at least In and Sb, where the light receiving layer has an Al composition at a proportion of $n_{light}$ [%] in all group III elements in the light receiving layer where $0 \leq n_{light} < 18$;
   a third compound semiconductor layer formed on the light receiving layer and having a second conductivity type; and
   a second compound semiconductor layer formed in at least one of regions between the light receiving layer and the third compound semiconductor layer or between the first compound semiconductor layer and the light receiving layer, containing at least In, Al, and Sb, having an Al composition at a proportion of $n_2$ [%] in all group III elements in the second compound semiconductor layer where $0 < n_2 < 100$, and having a film thickness of $m_2$ [nm] where $m_2 > 2$, wherein
   the first compound semiconductor layer comprises, in the stated order:
   a first A layer containing at least In and Sb and having an Al composition at a proportion of $n_{1A}$ [%] in all group III elements in the first A layer where $0 \leq n_{1A} < 18$;

a first B layer containing at least In and Sb, having an Al composition at a proportion of $n_{1B}$ [%] in all group III elements in the first B layer where $0 \leq n_{1B} < 100$, and having a film thickness of $m_{1B}$ [nm]; and a first C layer containing at least In and Sb and having an Al composition at a proportion of $n_{1C}$ [%] in all group III elements in the first C layer where $0 \leq n_{1C} < 18$, where $n_{1A}$, $n_{1B}$, $n_{1C}$, $n_2$, $n_{light}$, $m_{1B}$, and $m_2$ satisfy the following relations:

$|n_2 - n_{light}| \times m_2 \leq |n_{1B} - n_{1A}| \times m_{1B}$;

$n_{1B} > n_{1A}$ and $n_{1B} > n_{1C}$, or $n_{1B} < n_{1A}$ and $n_{1B} < n_{1C}$; and $n_2 > n_{light} + 5$.

2. The infrared detecting device according to claim 1, wherein $n_{light}$, $n_{1A}$, and $n_{1C}$ satisfy the following relations:

$8 \leq n_{light} \leq 12$;

$8 \leq n_{1A} \leq 12$; and $8 \leq n_{1C} \leq 12$.

3. The infrared detecting device according to claim 1, wherein $n_{light}$, $n_{1A}$, and $n_{1C}$ satisfy the following relations:

$4 \leq n_{light} \leq 8$;

$4 \leq n_{1A} \leq 8$; and $4 \leq n_{1C} \leq 8$.

4. The infrared detecting device according to claim 1, wherein $n_2$, $n_{light}$, and $m_2$ satisfy the following relation:

$|n_2 - n_{light}| \times m_2 \leq 572$.

5. The infrared detecting device according to claim 1, wherein $n_{light}$ and $n_2$ satisfy the following relation:

$n_2 > n_{light} + 7$.

6. The infrared detecting device according to claim 1, wherein $m_2$ satisfies the following relation:

$m_2 \geq 4$.

7. The infrared detecting device according to claim 1, wherein the first conductivity type is n type and the second conductivity type is p type.

8. The infrared detecting device according to claim 1, wherein infrared rays incident from the semiconductor substrate side are detected.

9. The infrared detecting device according to claim 1, wherein $n_{1A}$, $n_{1C}$, and $n_{light}$ are the same.

10. The infrared detecting device according to claim 1, wherein the second compound semiconductor layer is formed in both of regions between the light receiving layer and the third compound semiconductor layer and between the first compound semiconductor layer and the light receiving layer.

11. An infrared detecting device comprising:
a semiconductor substrate;
a first compound semiconductor layer formed on the semiconductor substrate and having a first conductivity type;
a light receiving layer formed on the first compound semiconductor layer, containing at least In and Sb, and having an Al composition at a proportion of $n_{Al\ light}$ [%] in all group III elements in the light receiving layer and a Ga composition at a proportion of $n_{Ga\ light}$ [%] in all group III elements in the light receiving layer, where a sum of the proportions $n_{Al\ light}$ and $n_{Ga\ light}$ satisfies a relation of $0 < n_{Al\ light} + n_{Ga\ light} < 18$;
a third compound semiconductor layer formed on the light receiving layer and having a second conductivity type; and
a second compound semiconductor layer formed in at least one of regions between the light receiving layer and the third compound semiconductor layer or between the first compound semiconductor layer and the light receiving layer, containing at least In, Al, and Sb, having an Al composition at a proportion of $n_{Al2}$ [%] in all group III elements in the second compound semiconductor layer where $0 \leq n_{Al2} < 100$ and a Ga composition at a proportion of $n_{Ga2}$ [%] in all group III elements in the second compound semiconductor layer where $0 \leq n_{Ga2} < 100$, and having a film thickness of $m_2$ [nm] where $m_2 > 2$, wherein the first compound semiconductor layer comprises, in the stated order:
a first A layer containing at least In and Sb and having an Al composition at a proportion of $n_{Al1A}$ [%] in all group III elements in the first A layer and a Ga composition at a proportion of $n_{Ga1A}$ [%] in all group III elements in the first A layer, where a sum of the proportions $n_{Al1A}$ and $n_{Ga1A}$ satisfies a relation of $0 < n_{Al1A} + n_{Ga1A} < 18$;
a first B layer containing at least In and Sb, having an Al composition at a proportion of $n_{Al1B}$ [%] in all group III elements in the first B layer and a Ga composition at a proportion of $n_{Ga1B}$ [%] in all group III elements in the first B layer, where a sum of the proportions $n_{Al1B}$ and $n_{Ga1B}$ satisfies a relation of $0 < n_{Al1B} + n_{Ga1B} < 100$, and having a film thickness of $m_{1B}$ [nm]; and
a first C layer containing at least In and Sb and having an Al composition at a proportion of $n_{Al1C}$ [%] in all group III elements in the first C layer and a Ga composition at a proportion of $n_{Ga1C}$ [%] in all group III elements in the first C layer, where a sum of the proportions $n_{Al1C}$ and $n_{Ga1C}$ satisfies a relation of $0 < n_{Al1C} + n_{Ga1C} < 18$, where $n_{Al1A}$, $n_{Ga1A}$, $n_{Al1B}$, $n_{Ga1B}$, $n_{Al1C}$, $n_{Ga1C}$, $n_{Al2}$, $n_{Ga2}$, $n_{Al\ light}$, $n_{Ga\ light}$, $m_{1B}$, and $m_2$ satisfy the following relations:

$|n_{Al2} + n_{Ga2} - (n_{Al\ light} + n_{Ga\ light})| \times m_2 + n_{Ga1B} - (n_{Al1A} + n_{Ga1A})| \times m_{1B}$;

$n_{Al1B} + n_{Ga1B} > n_{Al1A} + n_{Ga1A}$ and $n_{Al1B} + n_{Ga1B} > n_{Al1C} + n_{Ga1C}$, or $n_{Al1B} + n_{Ga1B} < n_{Al1A} + n_{Ga1A}$ and $n_{Al1B} + n_{Ga1B} < n_{Al1C} + n_{Ga1C}$;

$n_{Al2} + n_{Ga2} > n_{Al\ light} + n_{Ga\ light} + 5$;

$0 < n_{Ga2}/(n_{Al2} + n_{Ga2}) \leq 1$;

$0 < n_{Ga\ light}/(n_{Al\ light} + n_{Ga\ light}) \leq 1$;

$0 < n_{Ga1A}/(n_{Al1A} + n_{Ga1A}) \leq 1$;

$0 < n_{Ga1B}/(n_{Al1B} + n_{Ga1B}) \leq 1$; and $0 < n_{Ga1C}/(n_{Al1C} + n_{Ga1C}) \leq 1$.

12. The infrared detecting device according to claim 11, wherein $n_{Al\ light}$, $n_{Ga\ light}$, $n_{Al1A}$, $n_{Ga1A}$, $n_{Al1C}$, and $n_{Ga1C}$ satisfy the following relations:

$8 \leq n_{Al\ light} + n_{Ga\ light} < 12$;

$8 \leq n_{Al1A} + n_{Ga1A} \leq 12$; and $8 \leq n_{Al1C} + n_{Ga1C} \leq 12$.

13. The infrared detecting device according to claim 11, wherein $n_{Al\ light}$, $n_{Ga\ light}$, $n_{Al1A}$, $n_{Ga1A}$, $n_{Al1C}$, and $n_{Ga1C}$ satisfy the following relations:

$4 \leq n_{Al\ light} + n_{Ga\ light} \leq 8$;

$4 \leq n_{Al1A} + n_{Ga1A} \leq 8$; and $4 \leq n_{Al1C} + n_{Ga1C} \leq 8$.

14. The infrared detecting device according to claim 11, wherein $n_{Al2}$, $n_{Ga2}$, $n_{Al\ light}$, $n_{Ga\ light}$, and $m_2$ satisfy the following relation:

$|n_{Al2} + n_{Ga2} - (n_{Al\ light} + n_{Ga\ light}) \times m_2 \leq 572$.

15. The infrared detecting device according to claim 11, wherein $n_{Al\ light}$, $n_{Ga\ light}$, $n_{Al2}$, and $n_{Ga2}$ satisfy the following relation:

$n_{Al2} + n_{Ga2} > n_{Al\ light} + n_{Ga\ light} + 7$.

16. The infrared detecting device according to claim 11, wherein $m_2$ satisfies the following relation:

$m_2 \geq 4$.

17. The infrared detecting device according to claim 11, wherein the first conductivity type is n type and the second conductivity type is p type.

18. The infrared detecting device according to claim 11, wherein infrared rays incident from the semiconductor substrate side are detected.

19. The infrared detecting device according to claim 11, wherein $n_{Al1A}$, $n_{Al1C}$, and $n_{Al\ light}$ are the same, and $n_{Ga1A}$, $n_{Ga1C}$, and $n_{Ga\ light}$ are also the same.

20. The infrared detecting device according to claim 11, wherein the second compound semiconductor layer is formed in both of regions between the light receiving layer and the third compound semiconductor layer and between the first compound semiconductor layer and the light receiving layer.

* * * * *